United States Patent [19]

Nakamura et al.

[11] Patent Number: 5,358,795

[45] Date of Patent: Oct. 25, 1994

[54] HEAT-CONDUCTIVE MATERIAL AND METHOD OF PRODUCING THE SAME

[75] Inventors: Yasuyuki Nakamura, Takatsuki; Makoto Kawakami, Suita, both of Japan

[73] Assignee: Sumitomo Special Metals Co., Ltd., Osaka, Japan

[21] Appl. No.: 959,606

[22] Filed: Oct. 13, 1992

[30] Foreign Application Priority Data

Oct. 12, 1991 [JP] Japan .................. 3-292494
Oct. 12, 1991 [JP] Japan .................. 3-292495

[51] Int. Cl.$^5$ .............. B32B 3/24; H01L 23/373; H05K 7/20; B23K 20/04
[52] U.S. Cl. .............. 428/614; 428/675; 428/676; 428/620; 257/720
[58] Field of Search .............. 428/614, 620, 609, 675, 428/676, 677; 228/190; 257/713, 720, 677, 675; 361/704, 705, 706, 707, 708, 709, 723

[56] References Cited

U.S. PATENT DOCUMENTS

| | | | |
|---|---|---|---|
| 4,283,464 | 8/1981 | Hascoe | 428/614 |
| 4,427,993 | 1/1984 | Fichot et al. | 357/81 |
| 4,996,115 | 2/1991 | Eerkes et al. | 428/614 |
| 5,106,433 | 4/1992 | Nakamura et al. | 428/614 |

FOREIGN PATENT DOCUMENTS

| | | | |
|---|---|---|---|
| 385609 | 9/1990 | European Pat. Off. | 257/720 |
| 1-290245 | 11/1989 | Japan | 257/720 |

Primary Examiner—John Zimmerman
Attorney, Agent, or Firm—Watson, Cole, Grindle & Watson

[57] ABSTRACT

This invention provides heat-conductive materials which may receive evenly the heat as applied thereto, which have an improved heat-releasing effect, which are free from fine pores on the surfaces thereof and therefore have excellent adhesiveness to thin films of plating materials or brazing materials, which have excellent compatibility with materials to be applied thereto, such as chips or sealant resins, with respect to the thermal expansion coefficients of them, and have excellent thermal conductivity, and which may have any desired thermal expansion coefficient and thermal conductivity in accordance with the use and object of them. It also provides methods of producing the heat-conductive materials. One aspect of the heat-conductive materials is such that a two-layer sheet or three-layer sheet to be formed by previously welding under pressure a copper foil to one surface or both surfaces of a Kovar sheet followed by forming a number of small through-holes through the sheet has been welded under pressure to and integrated with one surface or both surfaces of a copper sheet as previously heated up to a temperature not lower than the recrystallizing temperature thereof with a heating device. Another aspect of them is such that a copper sheet as previously heated up to a temperature not lower than the recrystallizing temperature thereof has been welded under pressure to the lower surface of a Kovar sheet having a number of small through-holes therethrough, with a welding machine, and additionally another copper sheet has been welded under pressure to the upper surface of the same with a welding machine, all the welded sheets having been integrated together. Still another aspect of them is such that the materials of the first aspect and/or the second aspect have been laminated and integrated together. The heat-conductive materials of all the aspects have a high welding strength even though the welding of the constitutive sheets is effected at a small reduction ratio, and they may have determined thermal expansion coefficient and thermal conductivity without fluctuating the previously determined ratio of the copper exposing surface areas (through-hole areas) to the Kovar surface.

14 Claims, 7 Drawing Sheets

HEAT-CONDUCTIVE MATERIAL AND METHOD OF PRODUCING THE SAME

BACKGROUND OF THE INVENTION

1. Field of the Invention

The present invention relates to a heat-conductive composite material having excellent weldability to materials which are attached thereto and excellent surface property of itself, for use, for example, in manufacture of a heat-release substrate (heat sink) for mounting semiconductor chips thereon or of a lead frame in semiconductor packages, the thermal expansion coefficient and the thermal conductivity of the composite material being freely variable in order to satisfy both the compatibility with the thermal expansion coefficient of the materials which are attached thereto, such as metals, ceramics, Si and other semiconductors, and plastics, and the good thermal conductivity of itself so that the heat to be generated by semiconductor chips may efficiently be released out to the outside. In particular, it relates to a heat-conductive composite material which is produced in such a way that a two-layer material or three-layer material to be prepared by laminating a metal foil of high thermal expansion under pressure onto one surface or both surfaces of a metal sheet of low thermal expansion followed by integrating them and thereafter providing a number of through-holes through the integrated body in the thickness direction thereof is laminated under pressure onto one surface or both surfaces of a metal sheet having a high thermal expansion coefficient, which is at room temperature or has been heated to a temperature not lower than the recrystallizing temperature thereof, or in such a way that two-layer materials each to be prepared by laminating under pressure a metal sheet of high thermal expansion, which is at a room temperature or has been heated to a temperature not lower than the recrystallizing temperature thereof, onto one surface of a metal sheet of low thermal expansion having a number of through-holes as provided in the direction of the thickness thereof, or three-layer materials each to be prepared by further laminating under pressure a metal sheet of high thermal expansion onto the other surface of the metal sheet of low thermal expansion of the two-layer material are laminated to each other under pressure directly or optionally via a metal sheet of high thermal expansion. The heat-conductive composite material of the present invention has a high lamination strength, and the thermal expansion coefficient and the thermal conductivity of the material are variable without varying the ratio of the thickness of the selected metal sheets and the ratio of the area of the through-holes. Accordingly, the capacity of receiving heat of the material is uniform and the heat-diffusibility of the material is improved. The surface of the material is free from fine pores so that any thin film may well be coated thereon by plating or brazing. The present invention also relates to a method of producing the heat-conductive composite material.

2. Description of the Prior Art

Recently, integrated circuit chips (hereinafter referred to a "chips") of semiconductor packages, especially those in LSI or ULSI for large-scaled (super) computers, have been directed toward elevation of the integrated degree and acceleration of the operation speed, and therefore the quantity of heat generated by the operation of the devices has become extremely large due to increase of the electric power consumed.

That is, the capacity of the chips has become large-scaled and the quantity of heat generated during the operation has also become large. Accordingly, if the thermal expansion coefficient of the substrate material is significantly different from that of the material of the chip of silicon or gallium arsenide, the chip will peel off from the substrate or be broken.

For this reason, heat-diffusibility has to be taken into consideration in planning the semiconductor package, and therefore the substrate to which the chip is mounted must also have a proper heat-diffusibility. Accordingly, the substrate material is required to have a thermal expansion coefficient near to that of the chip and have a large thermal conductivity.

Conventional semiconductor packages of various constitutions have been proposed. For instance, one constitution is mentioned, in which the substrate is provided with heat-release fins. Composite materials for heat-release substrates (heat sinks), such as clad boards or Cu—Mo or Cu—W alloys for ensuring the heat-releasability, have been proposed (Japanese Patent Application Laid-Open Nos. 59-141247 and 62-294147).

The proposed composite materials meet the satisfactory conditions for practical use with respect to both the thermal expansion coefficient and the thermal conductivity. However, since Mo and W both have a high density and therefore are heavy and brittle, they must be shaped and machined by non-plastic machining such as grinding so as to obtain a shaped body having a determined dimension. Such machining needs a high machining cost so that the yield of the products from the materials is low.

In resin sealed semiconductor packages, not only the lead frame is to be a path for electrical connection with the outside parts but also it has an important role as a heat-releasing path for releasing the heat to be generated in the chips therein. For the reason, a lead frame made of a copper alloy is much used.

However, in the field of needing high reliability, copper alloys involve a danger of peeling the welded interface between a chip and an island, since they have a low mechanical strength and the thermal expansion coefficient of them is not compatible with that of chips. Therefore, in view of the compatibility of the thermal expansion coefficient of the lead frame material with that of a chip, a semiconductor package having an Ni—Fe alloy of low thermal expansion, such as 42% Ni—Fe alloy, has been proposed.

However, since Ni—Fe alloys have a poor thermal conductivity, they could not yield a thermal releasability capable of satisfying the current requirement. In addition, since the difference in the thermal expansion between a chip and a sealant resin is extremely large, the compatibility between a lead frame and the sealant resin is bad so that complete prevention of cracks in the resin is difficult even though the compatibility of the thermal expansion coefficient between the lead frame and the chip is good.

Further, in ceramic semiconductor packages, since sealing is effected by Al wire bonding or glass sealing, an Ni—Fe alloy provided with Al at the bonding area and the sealing position is much used as the lead frame. However, such an Ni—Fe alloy has a poor heat-releasability, as mentioned above, it involves a problem about the compatibility of the thermal expansion coefficient thereof with that of ceramics.

Under the situation, the present applicant already proposed a heat-conductive composite material, so as to solve the above-mentioned problem about the thermal expansion coefficient and/or the thermal conductivity, in which a metal foil of high thermal expansion has been laminated under pressure to the both surfaces of a core material comprising a metal sheet of low thermal expansion having necessary through-holes in the direction of the thickness, as integrated with a metal sheet of high thermal expansion in such a way that the metal of high thermal expansion is exposed out to the surface of the metal sheet of low thermal expansion through the said through-holes, the proportion of the thickness of these metal sheets and the proportion of the area of the through-holes having been selected suitably (Japanese Patent Application No. 2-40550). The proposed composite material is characterized in that the thermal expansion coefficient and the thermal conductivity is variable, that the capacity thereof of receiving heat is made even, that the heat-diffusing effect thereof is improved, that the surface thereof is free from fine pores and that the adhesiveness thereof to a thin film of a plating material or a brazing material is good.

In order to obtain the proposed heat-conductive composite material, a metal sheet of low thermal expansion such as a Kovar sheet is first stamped by pressing to form a number of small through-holes to make it reticulate, then annealed and coiled to make a metal sheet coil of low thermal expansion, the coil is uncoiled with laminating onto the both surfaces thereof a metal sheet coil of high thermal expansion as being uncoiled from both the above and the below of the former coil, and the laminated sheets are rolled and welded under pressure with large-diameter rolls by cold rolling or warm rolling and annealed for diffusion to obtain a core material, then a metal foil of high thermal expansion, such as Cu or Al foil, is laminated onto the both surfaces of the core material with the coil of the metal foil being uncoiled from both the above and the below of the core material, and the laminated core material is rolled and welded under pressure with rolls by cold rolling or warm rolling and annealed for diffusion.

In manufacturing the heat-conductive composite material, a metal foil of high thermal expansion such as Cu or Al foil is laminated onto the both surfaces of the core material and welded by cold rolling. In the step, if the reduction ratio is made too large so as to obtain a high welding strength, the circular or oval shape of the exposed area of the metal of high thermal expansion such as Cu or Al as exposed onto the surfaces of the core material would be a long oval shape whereby the selected proportion of the surface area between the metal of high thermal expansion and the metal of low thermal expansion would vary and accordingly the thermal expansion coefficient and/or the thermal conductivity of the laminated material would vary or the thermal expansion coefficient of the same would be anisotropic, defectively.

In order to evade the defective problem, it may be considered to employ a plating method in place of the rolling method, for coating the metal foil of high thermal expansion such as Cu or Al foil over the surfaces of the core material. According to the alternative method, however, a plating solution would remain in the interface between the metal of high thermal expansion and the metal of low thermal expansion on the surfaces of the core material after the material has been dipped in a plating bath, and this would be gasified in the subsequent diffusion-annealing step to often cause swelling or peeling of the plated layer. In addition, the plating step is generally complicated and needs much time, unfavorably.

SUMMARY OF THE INVENTION

One object of the present invention is to provide a heat-conductive material, which may receive heat evenly, which has an improved heat-diffusing effect, which is free from fine pores on the surface thereof, which has excellent adhesiveness to a thin film of plating or brazing material, which has excellent compatibility with materials to be welded therewith, such as chips or sealant resins, with respect to the thermal expansion coefficients of them, which has good thermal conductivity, and the thermal expansion coefficient and thermal conductivity of which may freely be selected in accordance with the use and object thereof. Another object of the present invention is to provide a method of producing the heat-conductive material by welding under pressure, without greatly varying the shape of the through-holes as provided through the metal sheet of low thermal expansion, to give the intended heat-conductive material having selected thermal expansion coefficient and/or thermal conductivity and having an improved welding strength to the respective metal of high thermal expansion and metal of low thermal expansion to be laminated.

The heat-conductive material to be obtained by the present invention is a multi-layered material substantially composed of three or more layers. In every aspect of the present invention, the heat-conductive material of the present invention is characterized in that a metal sheet of high thermal expansion to be disposed so as to essentially improve the thermal conductivity of the material is welded and integrated under pressure with other parts at room temperature or by heating the metal sheet to a temperature not lower than the recrystallizing temperature of the metal sheet. In particular, where the welding for integration is effected at a determined temperature not lower than the recrystallizing temperature of the metal sheet, the effect of the present invention may effectively be realized.

All the aspects of the heat-conductive material of the present invention which will be explained hereunder indispensably have the metal sheet of high thermal expansion having the above-mentioned characteristic feature and are therefore proposed in correspondence to the structure of other parts to be welded to and integrated with the said metal sheet of high thermal expansion. As a matter of course, all the heat-conductive materials of all the claimed aspects of the present invention attain the above-mentioned objects.

Also proposed by the present invention are the best methods of producing the heat-conductive materials of all the claimed aspects of the present invention.

Specifically, as the first aspect of the heat-conductive material of the present invention, there is provided a heat-conductive material, where a metal sheet of low thermal expansion, at least the outer surface of which has been welded under pressure with a metal foil of high thermal expansion and which has a number of through-holes in the direction of the thickness thereof, has been welded under pressure onto one surface or both surfaces of a metal sheet of high thermal expansion of having a room temperature or having been heated up to a temperature not lower than the recrystallizing temperature thereof, in such a way that the metal of high thermal expansion is exposed out to the surface of the metal foil of high thermal expansion through the through-holes so as to be integrated with the latter.

As a method of producing the heat-conductive material of the first aspect, the present invention provides a method of producing a heat-conductive material, in which a two-layer material to be formed by welding and integrating under pressure a metal foil of high thermal expansion with one surface of a metal sheet of low thermal expansion followed by forming a number of through-holes in the direction of the thickness of the integrated body is welded to and integrated with one surface or both surfaces of a metal sheet of high thermal expansion of having a room temperature or having been heated up to a temperature not lower than the recrystallizing temperature thereof at the side of the metal sheet of low thermal expansion of the integrated body in such a way that the metal of high thermal expansion is exposed out to the surface of the metal foil of high thermal expansion through the through-holes to be integrated with the latter.

As another method of producing the same, the present invention also provides a method of producing a heat-conductive material, in which a three-layer material to be formed by welding and integrating under pressure a metal foil of high thermal expansion with both surfaces of a metal sheet of low thermal expansion followed by forming a number of through-holes through the integrated body in the direction of the thickness thereof is welded to and integrated with one surface or both surfaces of a metal sheet of high thermal expansion of having room temperature or having been heated up to a temperature not lower than the recrystallizing temperature thereof in such a way that the metal of high thermal expansion is exposed out to the surface to the metal foil of high thermal expansion through the through-holes to be integrated with the latter.

As the second aspect of the heat-conductive material of the present invention, there is provided a heat-conductive material, where a metal sheet of high thermal expansion of being a room temperature or having been heated up to a temperature not lower than the recrystallizing temperature thereof has been welded under pressure onto one surface of a metal sheet of low thermal expansion having a number of through-holes in the direction of the thickness thereof, and thereafter a metal sheet of high thermal expansion has been welded under pressure also onto the other surface of the same.

As a method of producing the heat-conductive material of the second aspect, the present invention provides a method of producing a heat-conductive material, in which a metal sheet of high thermal expansion of being a room temperature or having been heated up to a temperature not lower than the recrystallizing temperature thereof is welded under pressure onto one surface of a metal sheet of low thermal expansion having a number of through-holes in the direction of the thickness thereof in such a way that the metal of high thermal expansion is exposed out to the surface ,of the metal sheet of low thermal expansion through the through-holes so as to be integrated with the latter, and thereafter a metal sheet of high thermal expansion is welded under pressure also onto the other surface of the metal sheet of low thermal expansion.

As the third aspect of the heat-conductive material of the present invention, there is provided a heat-conductive material, where two-layer materials each as formed by welding under pressure a metal sheet of high thermal expansion of being a room temperature or having been heated up to a temperature not lower than the recrystallizing temperature thereof onto one surface of a metal sheet of low thermal expansion having a number of through-holes in the direction of the thickness thereof have been welded and integrated together under pressure at the side of the respective metal sheets of low thermal expansion of facing to each other, via a metal sheet of high thermal expansion of being a room temperature or having been heated up to a temperature not lower than the recrystallizing temperature thereof.

As a method of producing the heat-conductive material of the third aspect, the present invention provides a method of producing a heat-conductive material, in which a two-layer material as formed by welding under pressure a metal sheet of high thermal expansion of being a room temperature or having been heated up to a temperature not lower than the recrystallizing temperature onto one surface of a metal sheet of low thermal expansion having a number of through-holes in the direction of the thickness thereof in such a way that the metal of high thermal expansion is exposed out to the surface of the metal sheet of low thermal expansion through the through-holes so as to be integrated with the latter is welded under pressure onto both surfaces of a metal sheet of high thermal expansion of being a room temperature or having been heated up to a temperature not lower than the recrystallizing temperature thereof at the side of the metal sheet of low thermal expansion of the two-layer material.

As the fourth aspect of the heat-conductive material of the present invention, there is provided a heat-conductive material, where three-layer materials each as formed by welding under pressure a metal sheet of high thermal expansion of being a room temperature or having been heated up to a temperature not lower than the recrystallizing temperature thereof onto one surface of a metal sheet of low thermal expansion having a number of through-holes in the direction of the thickness thereof and additionally welding a metal sheet of high thermal expansion onto the other surface of the same have been welded and integrated together under pressure directly or via a metal sheet of high thermal expansion of being a room temperature or having been heated up to a temperature not lower than the recrystallizing temperature thereof.

As a method of producing the heat-conductive material of the fourth aspect, the present invention provides a method of producing a heat-conductive material, in which three-layer materials each as formed by welding under pressure a metal sheet of high thermal expansion of being a room temperature or having been heated up to a temperature not lower than the recrystallizing temperature thereof onto one surface of a metal sheet of low thermal expansion having a number of through-holes in the direction of the thickness thereof in such a way that the metal of high thermal expansion is exposed out to the surface of the metal sheet of low thermal expansion through the through-holes so as to be integrated with the latter, and additionally welding a metal sheet of high thermal expansion onto the other surface of the same, are welded together under pressure at a room temperature or by heating up to a temperature not lower than the recrystallizing temperature of the metal sheet of high thermal expansion, directly or via a metal sheet of high thermal expansion of being a room temperature or having been heated up to a temperature not lower than the recrystallizing temperature thereof.

As preferred embodiments of the heat-conductive materials of all the above-mentioned aspects of the present invention, the metal sheet of high thermal expansion is made of anyone of Cu, Cu alloys, Al alloys, Ag and Ag alloys.

the metal sheet of low thermal expansion is made of anyone of Mo, Ni—Fe alloys each containing 30 to 50 wt. % of Ni, Ni—Co—Fe alloys each containing 25 to 35 wt. % of Ni and 4 to 20 wt. % of Co, and W; and the metal foil of high thermal expansion is made of anyone of Cu, Cu alloys, Al, Al alloys, Ag and Ag alloys.

As the preferred embodiment of the five-layer heat-conductive material of them, which is substantially composed of five layers, the thickness $t_1$ of the metal sheet of high thermal expansion, the thickness $t_2$ of the metal sheet of low thermal expansion and the thickness $t_3$ of the metal foil layer of high thermal expansion satisfy the following expressions:

$$t_1 = 1t_2 \text{ to } 5t_2,$$

$$t_3 \leq 1/10\ t_2,$$

$$t_1 + t_2 = 0.1 \text{ to } 30 \text{ mm},$$

$$t_3 = 2 \text{ to } 100\ \mu m.$$

The present invention further provides a heat-conductive material, which has a metal plate layer of anyone of Cu, Al, Ni and Sn, at desired position(s) of at least one main surface of anyone of the heat-conductive materials of the above-mentioned aspects of the present invention.

For instance, a plating material of anyone of the above-mentioned metals or a brazing material is applied to desired position(s) of the metal foil of high thermal expansion to be disposed as the outermost layer of anyone of the heat-conductive materials of the above-mentioned aspects of the present invention, by pressing or lamination, to give heat-conductive materials of various uses, for example, for heat-releasing substrates (heat sinks) for mounting chips thereon and lead frames in ceramic packages or metal packages.

DETAILED DESCRIPTION OF PREFERRED EMBODIMENTS

Figure 1:
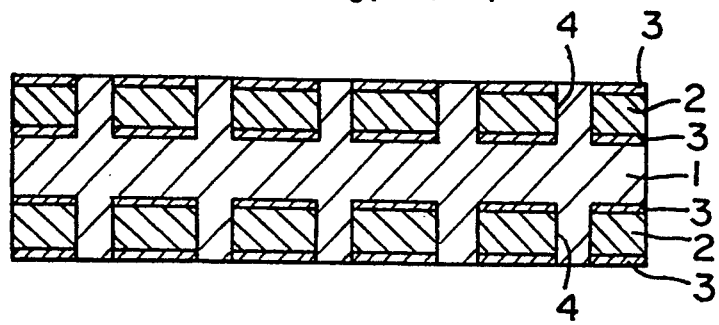
FIGS. 1(A), (B), 1(C) and 1(D), are longitudinal explanatory views of each showing the heat-conductive material of the first aspect of the present invention.
Figure 1:
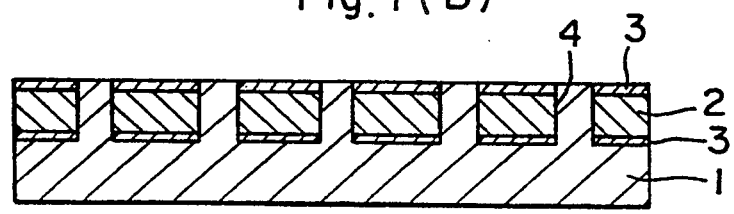
Figure 1:
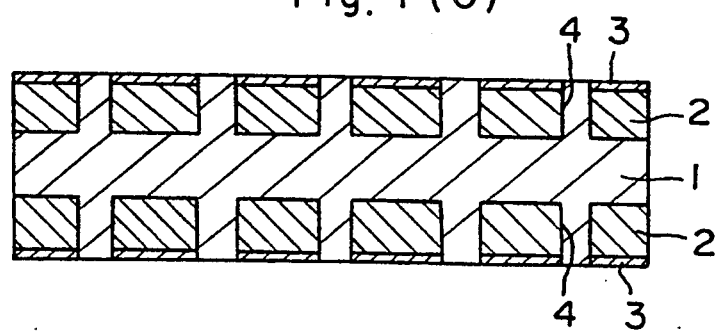
Figure 1:
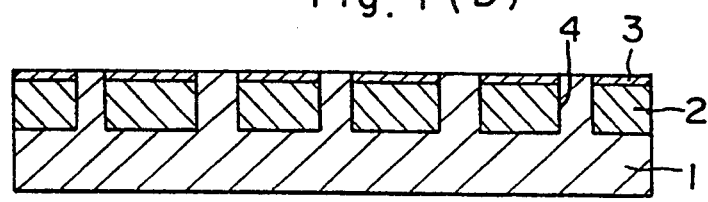

Characteristic features of the heat-conductive materials of the above-mentioned various aspects of the present invention as well as those of the methods of producing them are mentioned in more detail hereunder.

The heat-conductive material of the first aspect of the present invention is characterized in that a metal sheet of low thermal expansion, at least the outer surface of which has been welded under pressure with a metal foil of high thermal expansion and which has a number of through-holes in the direction of the thickness thereof, has been welded under pressure onto one surface or both surfaces of a metal sheet of high thermal expansion of having a room temperature or having been heated up to a temperature not lower than the recrystallizing temperature thereof, in such a way that the metal of high thermal expansion is exposed out of the surface of the metal foil of high thermal expansion through the through-holes so as to be integrated with the latter. The heat-conductive material may have a freely variable thermal expansion coefficient by essentially selecting the thickness ratio of the metal sheet of high thermal expansion. Using a metal of high thermal conductivity as the metal of high thermal expansion to be a core material and suitably selecting the exposing surface area ratio on the same surface between the metal of high thermal expansion as intruded into the through-holes and the metal sheet of low thermal expansion, the thermal conductivity of the heat-conductive material may freely be varied. Accordingly, by desired selection and combination of the material of the metal sheet of high thermal expansion and that of the metal sheet of low thermal expansion as well as by desired selection of the above-mentioned thickness ratio and exposing surface area ratio, any desired thermal expansion coefficient and thermal conductivity of the heat-conductive material of the present invention may be settled in accordance with various uses and objects thereof. Thus, heat-conductive materials of various kinds for various uses may be provided by the present invention.

The method of producing the heat-conductive material of the first aspect of the present invention mentioned above comprises only a simple step of welding under pressure a metal sheet of low thermal expansion, to one surface of both surfaces of which a metal foil of high thermal expansion has been welded under pressure and which has a number of through-holes in the direction of the thickness thereof, to a metal sheet of high thermal expansion to give the intended heat-conductive material. In the case, since welding under pressure of the two metal sheets is effected only one time, deformation of the shape of the exposed area of the metal of high thermal expansion is small so that the exposing surface area ratio on the same surface between the previously selected metal sheet of high thermal expansion and metal sheet of low thermal expansion does not vary so much and, as a result, a heat-conductive material having a determined thermal expansion coefficient and a determined thermal conductivity can be obtained.

In addition, in accordance with the method of producing the heat-conductive material of the first aspect of the present invention mentioned above, since the metal foil of high thermal expansion has previously been welded under pressure to the metal sheet of low thermal expansion prior to forming through-holes through the metal sheet of low thermal expansion, air is hardly intruded into the periphery of each through-hole during welding under pressure of the metal sheet of low thermal expansion and the metal sheet of high thermal expansion so that peeling of the metal foil of high thermal expansion may well be retarded. As a result, the heat-conductive material to be obtained may have an outer surface which is homogeneous and has an excellent property. Therefore, the material does not need any further cladding or plating of a metal foil of high thermal expansion thereover.

In producing the heat-conductive material of the first aspect of the present invention mentioned above, since the metal sheet of high thermal expansion is heated up to a temperature not lower than the recrystallizing temperature thereof when the metal sheet of high thermal expansion is welded under pressure to the metal sheet of low thermal expansion, one surface or both surfaces of which have been welded with a metal foil of high thermal expansion and which has a number of through-holes in the direction of the thickness thereof, and additionally, since the metal sheets of high thermal expansion, each of which has been welded under pressure with a metal sheet of low thermal expansion, are welded together under pressure, a high welding strength may be obtained even under a low rolling pressure so that deformation of the shape of the through-holes as provided through the metal sheet of low thermal expansion is small and the previously selected exposing surface area ratio (through-hole area ratio) on the same surface between the metal of high thermal expansion as intruded into the through-holes and the metal sheet of low thermal expansion is not varied. As a result, the heat-conductive material to be obtained by the method may have the determined thermal expansion coefficient and thermal conductivity.

In particular, by heating the metal sheet of high thermal expansion to a temperature not lower than the recrystallizing temperature thereof in welding it under pressure to a metal sheet of low thermal expansion, one surface or both surfaces of which have been welded under pressure with a metal foil of high thermal expansion and which has a number of through-holes in the direction of the thickness, the metal of high thermal expansion may well penetrates into the through-holes of the metal sheet of low thermal expansion even under a low rolling pressure so that the former is exposed out to the surface of the metal foil of high thermal expansion and additionally the welding strength is noticeably elevated. Moreover, because of the welding effect of the same material of the metal foil of high thermal expansion as welded under pressure to the metal sheet of low thermal expansion and the heated metal sheet of high thermal expansion, a high welding strength may well be obtained even under a lower rolling pressure so that the rolling ratio (reduction ratio) may be made small and therefore the variation of the above-mentioned exposing surface area ratio may also be made small.

Where the material of the metal foil of high thermal expansion and that of the metal of high thermal expansion as exposed out to the surface of the foil are the same, since the metal sheet of high thermal expansion to be exposed out in welding under pressure thereof has previously been heated up to a temperature not lower than the recrystallizing temperature thereof, integration of the metal sheet of high thermal expansion with the metal foil of high thermal expansion is possible to give an extremely excellent surface property of the composite material to be formed.

In addition, in the method of producing the heat-conductive material of the first aspect of the present invention, through-holes are partly or wholly provided through a metal sheet of low thermal expansion in the direction of the thickness thereof at determined intervals to have a desired pattern, prior to laminating the metal sheet of low thermal expansion, one surface or both surfaces of which have been welded under pressure with a metal foil of high thermal expansion, onto the whole of one surface or both surfaces of a metal sheet of high thermal expansion. For instance, therefore, the size and shape of each through-hole and the pattern of disposition of the through-holes may be varied, or notches penetrating or not penetrating through the direction of the thickness of the metal sheet may be provided in consideration of the deformation of the sheet by rolling, in order that the thickness ratio of the metal sheet of the core material and/or the exposing surface area ratio between the metal of high thermal expansion as exposed out to the surface of a metal sheet of low thermal expansion and the metal of low thermal expansion may suitably be selected. By combining the above-mentioned means, any desired thermal expansion coefficient and thermal conductivity may well be settled in the whole or the desired parts of the heat-conductive composite material to be obtained, in accordance with the use and object of the material. For instance, any desired heat-conductive composite material may thus be obtained, having desired compatibility of the thermal expansion coefficient of itself with that of other materials, which are to be applied to the composite material, such as determined metals, ceramics, semiconductors such as Si, or plastics, and having a desired thermal conductivity.

The heat-conductive materials of the second to fourth aspects of the present invention are characterized in that two-layer materials, each as formed by welding under pressure a metal sheet of high thermal expansion of being a room temperature or having been heated up to a temperature not lower than the recrystallizing temperature thereof to one surface of a metal sheet of low thermal expansion having a number of through-holes in the direction of the thickness thereof, have been welded together under pressure via a metal sheet of high thermal expansion; or that a three-layer material as formed by welding under pressure a metal sheet of high thermal expansion to the surface of the metal sheet of low thermal expansion of the said two-layer material is used as it is; or that the three-layer materials are welded together under pressure directly or via a metal sheet of high thermal expansion to give a five-layer material. The thermal expansion coefficient of the heat-conductive materials of these aspects may freely be varied essentially by proper selection of the thickness ratio of the metal sheets of high thermal expansion. For instance, using a metal having a high thermal conductivity as the metal of high thermal expansion to be the core material and suitably selecting the exposing surface area ratio on the same surface between the metal of high thermal expansion as intruded into the through-holes and the metal sheet of low thermal expansion, the thermal conductivity of the resulting heat-conductive composite material may freely be varied. Accordingly, by suitable selection of the materials of the metal sheet of high thermal expansion and the metal sheet of low thermal expansion and suitable combination of them, and also by suitable selection of the above-mentioned thickness ratio and exposing surface area ratio, the thermal expansion coefficient and the thermal conductivity of the heat-conductive composite material to be obtained may freely be settled in accordance with various uses and objects thereof. Thus, heat-conductive materials of various kinds may be provided by the present invention.

In accordance with the method of producing the heat-conductive materials of the above-mentioned aspects of the present invention, a two-layer material to be formed by welding under pressure a metal sheet of high thermal expansion onto one surface of a metal sheet of low thermal expansion having a number of through-holes in the direction of the thickness thereof is used as a starting material, and this is combined and laminated with a metal sheet of high thermal expansion or with the above-mentioned three-layer material. Therefore, the surface of the outer surface layer, which is made of a metal of high thermal expansion, of the heat-conductive composite material thus produced is homogeneous and has excellent property and this has a high welding strength to a metal of low thermal expansion.

In addition, since the above-mentioned heat-conductive materials of the present invention each are basically composed of three layers, the percentage of yielding fault products is low, and the manufacturing process is simple. In addition, the producibility of them is high and they are produced inexpensively.

In producing the heat-conductive materials of the second to fourth aspects of the present invention mentioned above, since a metal sheet of high thermal expansion is especially heated up to a temperature not lower than the recrystallizing temperature thereof when the metal sheet of high thermal expansion is welded under pressure to one surface of a metal sheet of low thermal expansion having a number of through-holes in the direction of the thickness thereof, or since both the metal materials of high thermal expansion each as welded under pressure to a metal sheet of low thermal expansion are welded together or a metal of high thermal expansion as exposed out through the through-holes is welded-under pressure to the interlaying metal sheet of high thermal expansion when the above-mentioned two-layer materials or three-layer materials are welded together under pressure, a high welding strength may be obtained even under a low rolling pressure so that deformation of the shape of the through-holes as provided through the metal sheet of low thermal expansion is small and the previously selected exposing surface area ratio (through-hole area ratio) on the same surface between the metal of high thermal expansion as intruded into the through-holes and the metal sheet of low thermal expansion is not varied. As a result, the heat-conductive materials to be obtained by the method each may have the determined thermal expansion coefficient and thermal conductivity.

More precisely, by heating a metal sheet of high thermal expansion up to a temperature not lower than the recrystallizing temperature thereof in welding it to a metal sheet of low thermal expansion having through-holes, the metal of high thermal expansion may well be intruded into the through-holes of the metal sheet of low thermal expansion under a small rolling pressure so as to be exposed out to the opposite surface of the metal sheet of low thermal expansion, without generating any air bubbles and the like pores in the inside of the through-holes. Accordingly, due to the welding effect of the same materials of the metal sheet of high thermal expansion to be welded under pressure to the other surface of a metal sheet of low thermal expansion and the above-mentioned heated metal sheet of high thermal expansion, a high welding strength may be obtained under a smaller rolling pressure to be able to lower the necessary reduction is possible to yield an extremely high welding strength.

In addition, in the case, the fluidity of the metal of high thermal expansion is improved so that the metal may smoothly be intruded into through-holes and, as a result, the thickness of the metal sheet of high thermal expansion to be successively welded to form an outermost layer may be made thin to such a degree as being equivalent to the thickness of the case of having a plated layer of a metal material of high thermal expansion.

In addition, in the method of producing the heat-conductive materials of the second to fourth aspects of the present invention, through-holes are partly or wholly provided through a metal sheet of low thermal expansion in the direction of the thickness thereof at determined intervals to have a desired pattern. For instance, by varying the size (opening diameter) or shape of the through-holes as well as the pattern of disposing them, or by providing notches penetrating or not penetrating to the direction of the thickness in consideration of the deformation during rolling, or by suitably selecting the thickness ratio of the metal sheets of constituting the core material and/or the exposing surface area ratio between the metal of high thermal expansion of exposing out to the surface of a metal sheet of low thermal expansion and the metal of low thermal expansion, or by suitably combining the means, any desired thermal expansion coefficient and thermal conductivity may well be settled in the whole or the desired parts of the heat-conductive composite material to be obtained, in accordance with the use and object of the material. For instance, any desired heat-conductive composite material may thus be obtained, having desired compatibility of the thermal expansion coefficient of itself with that of other materials, which are to be applied to the composite material, such as determined metals, ceramics, semiconductors such as Si, or plastics, and having a desired thermal conductivity.

In the heat-conductive materials of all the above-mentioned aspects, since the metal sheet of high thermal expansion is filled under pressure into the inside of the through-holes of the metal sheet of low thermal expansion by welding under pressure, the former is desired to be a material of high ductility and elongation and high thermal conductivity, such as Cu, Cu alloys, Al, Al alloys, Ag or Ag alloys.

As the metal sheet of low thermal expansion for the heat-conductive materials, usable is a material of high ductility, such as Mo, Ni—Fe alloys containing from 30 to 50% by weight of Ni, Ni—Co—Fe alloys containing from 25 to 35% by weight of Ni and from 4 to 20% by weight of Co, and W.

As the metal foil of high thermal expansion to be the outermost layer of them, usable is a material of Cu, Cu alloys, Al, Al alloys, Ag or Ag alloys. In consideration of the use and the material of a thin film layer to be welded thereto, the foil may well be selected from various materials same as or different from those of the metal sheet of high thermal expansion of the core material.

In addition, for the purpose of improving the brazing property or corrosion resistance or for the purpose of improving the adhesiveness to Au or Ag plating layer in accordance with the use of the heat-conductive material to be produced by the present invention, Cu, Al, Ni, Sn, Soldar or the like may be coated over the material by any known coating means such as plating, metal vapor deposition, ion plating or CVD (chemical vapor deposition) or Dipping in Molten Metal or Fusing and Solidification in Furnace at any desired positions, or the material may also be coated with soldering material, Ag-brazing material, ceramics or glass layer also at any desired positions.

The metal sheet of low thermal expansion of constituting the heat-conductive material of the first aspect of the present invention, to the surface of which metal sheet is welded under pressure a metal foil of high thermal expansion, has through-holes in the direction of the thickness thereof, and the metal sheet of low thermal expansion of constituting the heat-conductive materials of the second to fourth aspects of the present invention also has through-holes in the direction of the thickness thereof. The through-holes may be formed by mechanical operation such as press-stamping or by chemical operation such as etching. The distance between the respective through-holes is desired to be narrow, since the distribution of the products to be obtained may advantageously be reduced. In general, therefore, it is 3 mm or less, preferably 1 mm or less, more preferably 0.5 mm or less. The shape of the through-holes is not specifically defined. For instance, the cross-sectional shape of them may be either circular or polygonal; and the longitudinal-sectional shape of them may be either straight or tapered. A tapered shape is preferred, since intrusion of a metal into the inside of the through-holes is easy and the welding strength may be elevated.

The through-holes of the metal sheet of low thermal expansion in question in the direction of the thickness thereof may be such that may well be filled with a metal of high thermal expansion after welding and rolling under pressure. For instance, therefore, notches of penetrating through the non-rolled metal sheet of low thermal expansion or not penetrating but just before penetrating therethrough in the determined direction of the thickness of the sheet may be formed; or notches of various shapes may suitably be formed into the both surfaces of the metal sheet from various directions to have the same disposition as that of the above-mentioned through-holes. In the case, the shape of the notches is not specifically defined but may be selected from various shapes of, for example, "—", "+" and "<". In addition, wedge-wise notches, such as trigonal pyramid-like notches, may also be formed in the determined direction of the thickness of the metal sheet.

In the present invention, the reduction ratio is needed to be about 60% for cold rolling. Where a metal sheet of high thermal expansion is heated, bonding of metals of high thermal expansion to each other is to be extremely favorable crystallographically so that the reduction ratio may be lowered to about 20%. Preferably, the reduction ratio is from 30 to 50%.

The heat-conductive materials of the present invention as well as methods of producing them are mentioned below in detail with reference to the drawings attached hereto.

FIGS. 1(A), 1(B), 1(C) and 1(D) are longitudinal explanatory views of each showing the heat-conductive material of the first aspect of the present invention, in each of which the part to be welded under pressure and integrated with a metal sheet of high thermal expansion is characterized by comprising a metal sheet of low thermal expansion having a metal foil of high thermal expansion as provided on the surface thereof and having a number of through-holes in the direction of the thickness thereof.

Figure 2:
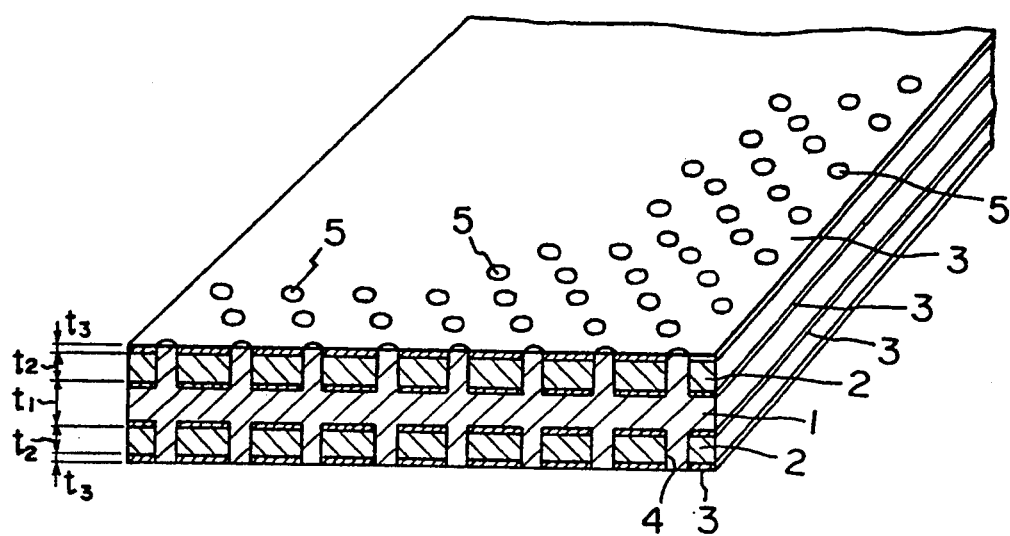
FIG. 2 is a partly-cut perspective explanatory view of showing the heat-conductive material of FIG. 1(A).

FIG. 2 is a partly-cut perspective explanatory view of showing the heat-conductive material of FIG. 1(A).

With reference to these drawings, one embodiment of having a copper sheet as the metal sheet of high thermal expansion and having a Kovar (Fe—Co—Ni alloy) sheet as the metal sheet of low thermal expansion is mentioned below.

The heat-conductive material of FIG. 1(A) has such a constitution that the both surfaces of copper sheet (1) are welded under pressure with Kovar sheet (2) having metal foil layers of high thermal expansion (3)(3) as provided on the both surfaces thereof and having a number of through-holes (4)(4) . . . in the direction of the thickness thereof.

The Kovar sheet (2) having the metal foil layers of high thermal expansion (3)(3), which is welded under pressure to the both surfaces of the copper sheet (1), has through-holes (4)(4) . . . each having the same dimension in the direction of the thickness thereof to thereby give circular copper exposing areas (5)(5) . . . on the surface of the metal foil layer of high thermal expansion (3) (refer to FIG. 2). Where the metal foil layer of high thermal expansion (3) is the same material of copper as the copper sheet (1), the copper exposing areas (5)(5) . . . are diffused to and integrated with the sheet (1) in such a degree that the former areas could not be differentiated from the latter sheet.

The Kovar sheet (2) has through-holes (4)(4) . . . each having the same dimension in the direction of the thickness thereof. The through-holes (4)(4) . . . may be tapered so that the diameter of each hole is different from each other in the both surfaces, and they may be arranged in such a way that the adjacent through-holes each have a different diameter and that the arrangement comprises combination of large and small through-holes.

By suitably selecting the thickness of the Kovar sheet (2) to be welded under pressure to the both surfaces of the copper sheet (1) via the metal foil layer of high thermal expansion (3) and also by selecting the ratio of the copper exposing areas (5)(5) . . . and the dispersed condition of them, the thermal characteristics of the respective main surfaces may be made near to the desired ones.

Since the metal foil layer of high thermal expansion (3) of the outermost layer is selected from Cu, Cu alloys, Al, Al alloys, Ag and Ag alloys in consideration of the use and the material of a thin layer to be coated thereover, the composite material may have improved properties of uniform heat receivability, high heat diffusibility, high weldability to materials to be welded thereto and high adhesiveness to a thin film to be coated thereover.

The heat-conductive material of FIG. 1(B) has such a constitution that Kovar sheet (2) having metal foil layers of high thermal expansion (3)(3) as provided on the both surfaces thereof and having a number of through-holes (4)(4) . . . in the direction of the thickness thereof is welded under pressure to only one surface of copper sheet (1).

The heat-conductive material of FIG. 1(C) has such a constitution that Kovar sheets (2)(2) each having metal foil layer of high thermal expansion (3) as provided on only one surface thereof and having a number of through-holes (4)(4) . . . in the direction of the thickness thereof are welded under pressure to the both surfaces of copper sheet (1) in such a way that the metal foil layers of high thermal expansion (3)(3) are positioned on the both outer surfaces.

The heat-conductive material of FIG. 1(D) has such a constitution that Kovar sheet (2) having a metal foil layer of high thermal expansion (3) as provided on one surface thereof and having a number of through-holes (4)(4) . . . in the direction of the thickness thereof is welded under pressure to only one surface of copper sheet (1) in such a way that the metal foil layer of high thermal expansion (3) is positioned on one outer surface.

Figure 3:
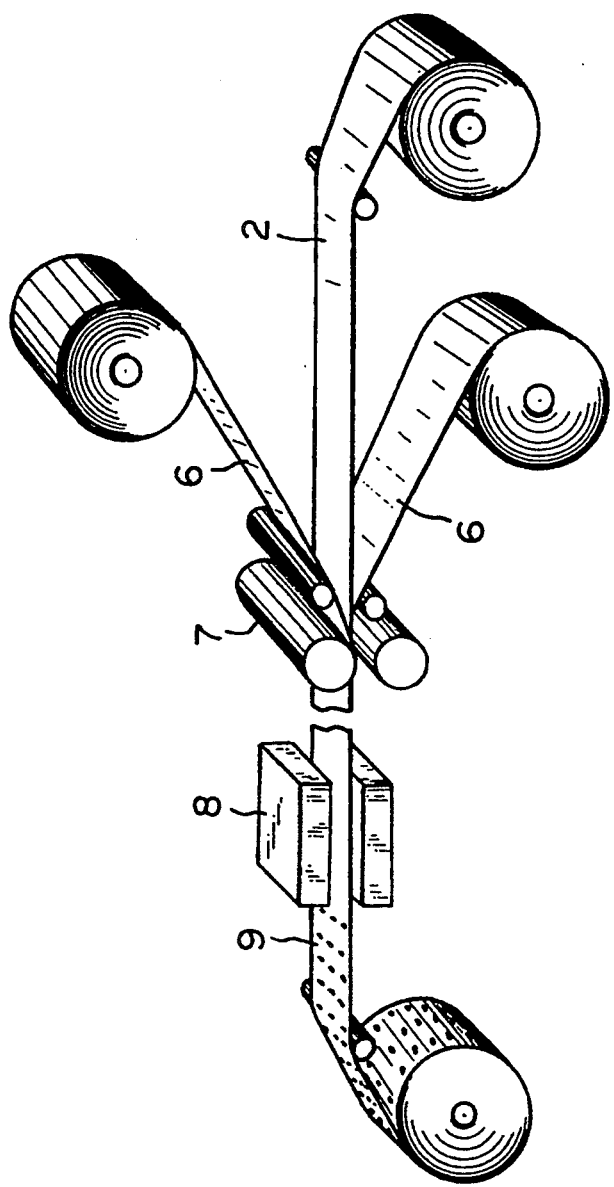
FIGS. 3 to 5 are perspective explanatory views of each showing one embodiment of the equipment for producing the heat-conductive material of the present invention.

In producing the heat-conductive material of FIG. 1 (A), which comprises a copper sheet, Kovar sheets and metal foils, copper foils (6)(6) are previously welded under pressure to the both surfaces of Kovar sheet (2) having determined dimension and thickness with press-welding rolls (7)(7), the laminated sheet of a determined length is stocked in a looper device, and thereafter the sheet is stamped with stamping machine (8), with which, for example, a number of small through-holes are made through the sheet to give a reticulate pattern to the sheet, then the sheet is annealed, surface-treated and coiled up, as shown in FIG. 3. Alternatively, after pressure welding with the press-welding rolls (7)(7), the welded sheet may then be coiled up and thereafter uncoiled to be conveyed to the stamping machine where the uncoiled sheet is stamped. In producing the heat-conductive materials of FIGS. 1(B), 1(C) and 1(D), similarly to the production of the heat-conductive material of FIG. 1(A), the thermal characteristics of the respective main surfaces may suitably be adjusted by selecting the thickness etc. of Kovar sheet (2) or copper sheet (1).

Figure 4:
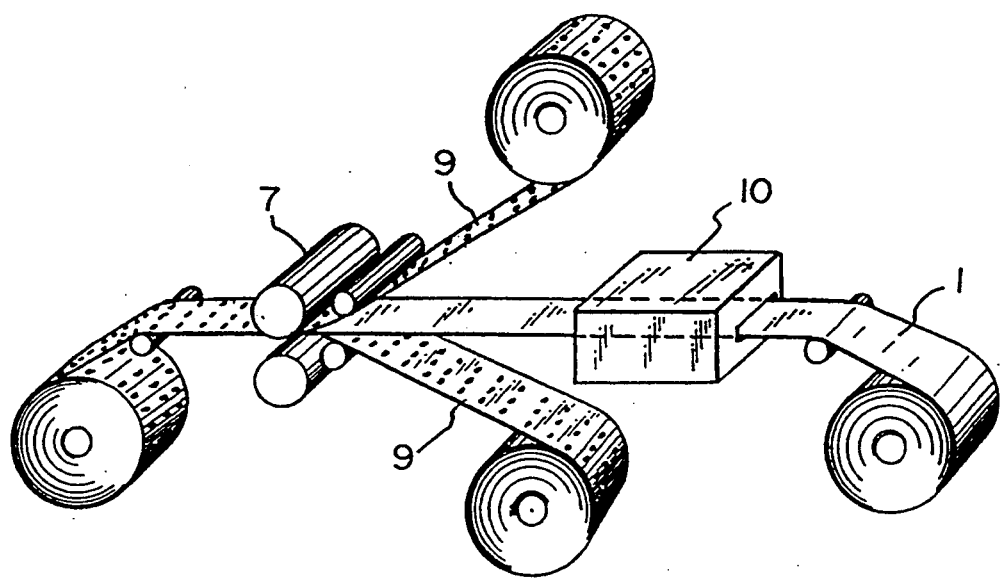

Next, as shown in FIG. 4, copper sheet (1) having determined dimension and thickness is uncoiled and heated in heating device (10) up to a temperature not lower than the recrystallizing temperature thereof, and the previously prepared stamped three-layer sheets (9)(9) each as uncoiled from above and below are laminated over the heated sheet (1) and welded together under pressure with press-welding rolls (7)(7).

Since the copper sheet is previously heated up to a temperature not lower than the recrystallizing temperature thereof prior to pressure welding of the sheet (1) and the stamped three-layer sheets (9)(9), the copper sheet (1) may intrude into the through-holes of the Kovar sheet (2) under a low pressure so as to be exposed out to the surface of the copper foil (6) of the Kovar sheet (2); and since the copper foil (6) between the copper sheet (1) and the Kovar sheet (2) and the copper sheet (1) as well as the copper foil (6) of the outermost layer and the copper sheet (1) are well diffused and integrated together, a high welding strength may be obtained even under a small pressure. As a result, deformation of the shape of each through-hole as provided through the Kovar sheet (2) is small so that the composite material thus obtained may have determined thermal expansion coefficient and thermal conductivity without varying the previously determined exposing surface area ratio between the exposed copper sheet (1) on the surface of the Kovar sheet (2) and the Kovar sheet (2) and without causing anisotropy in thermal expansion of the material.

In the above-mentioned pressure welding, the heating atmosphere for heating the metal sheet of high thermal expansion and the welding atmosphere of the laminated sheets are desired to be non-oxidizing ones. For instance, employable as the atmosphere is $N_2$, Ar, $H_2$ or a mixed gas atmosphere of them, as well as an ammonia-decomposed gas or propane combustion gas (DX) atmosphere.

The heating device may suitably be selected in accordance with the material of the metal of high thermal expansion. In general, usable is a tubular furnace column, a light beam heating device, a laser heating device, a high frequency heating device, or a plasma heating device.

The heating temperature for the metal sheet of high thermal-expansion may suitably be selected from a temperature range of from the recrystallizing temperature of the selected metal material to lower than the melting point of the same. Preferred is a temperature falling within the range of from a temperature lower than the melting point of the metal material to be heated by b 100° 1 C. to lower than the melting point thereof. For instance, for heating a copper or copper alloy sheet, the heating temperature is from 950° to 1050° C.; for heating an Al or Al alloy sheet, it is from 550° to 650° C.; and for heating an Ag or Ag alloy sheet, it is from 800° to 900° C.

In the above-mentioned process of FIG. 4, where the stamped sheet (9) is applied to the uncoiled copper sheet (1) as previously heated up to a temperature not lower than the recrystallizing temperature thereof only from either above or below, a heat-conductive material of FIG. 1(B) as mentioned above is obtained.

Figure 5:
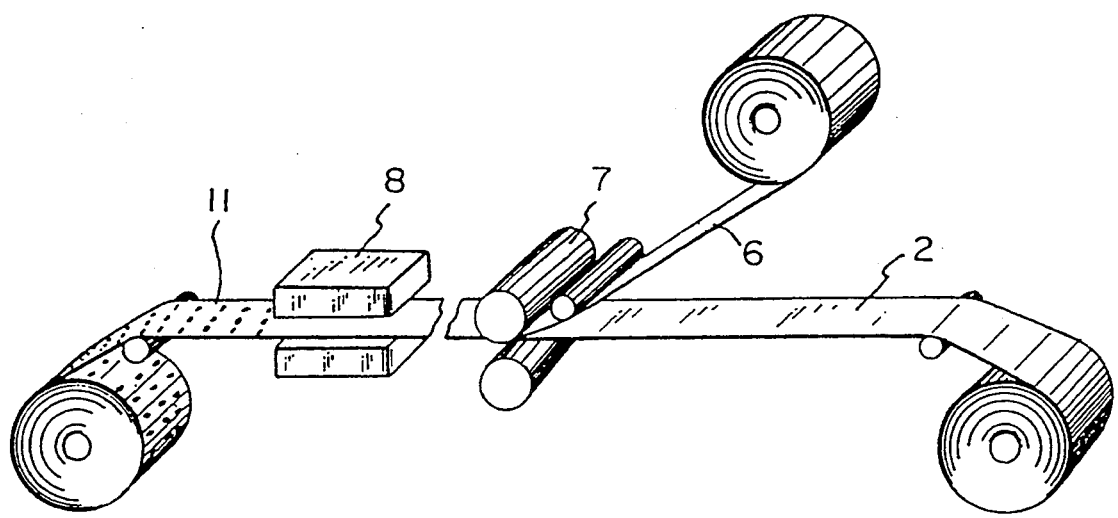

In place of the stamped three-layer sheet (9) composed of the Kovar sheet (2) to the both surfaces of which the copper foils (6)(6) have been welded under pressure, a stamped two-layer sheet (11), which is obtained by welding under pressure copper foil (6) onto the upper surface of Kovar sheet (2) with press-welding rolls (7)(7), stocking the welded sheet of a determined length in a looper device and thereafter stamping it with stamping machine (8), as shown in FIG. 5, may be worked in the same manner as in FIG. 4 where the Kovar sheet (2) of each of the stamped two-layer sheets (11)(11) is laminated onto the both surfaces of copper sheet (1) as previously heated up to a temperature not lower than the recrystallizing temperature thereof and welded together under pressure. In the case, a heat-conductive material of the above-mentioned FIG. 1(C) of the present invention is obtained. Alternatively, after the laminated sheets have been welded together under pressure with the press-welding rolls (7)(7), then coiled up and thereafter uncoiled to be conveyed to the stamping machine (8), and stamped there.

In the above-mentioned process, where the Kovar sheet (2) of the stamped two-layer sheet (11) is laminated onto only one surface of the copper sheet (1) as previously heated up to a temperature not lower than the recrystallizing temperature and welded together under pressure, a heat-conductive material of the above-mentioned FIG. 1(D) is produced.

Since the Kovar sheets (2)(2) are welded under pressure to the both surfaces of the copper sheet (1) in preparing the above-mentioned heat-conductive material having the stamped two-layer sheet (11), the welded sheet is desired to be annealed at a low temperature so as to obtain the welding strength comparable to that of the heat-conductive material having the three-layer sheet (9) where welding have been made between the constitutive copper materials.

Since the copper foil (6) of the outermost layer of the heat-conductive material has previously been welded under pressure to the Kovar sheet (2) in both cases of using the stamped three-layer sheet (9) and the stamped two-layer sheet (11) as the constitutive part, the heat-conductive materials to be obtained in the both cases have the same merit of involving few defects of peeling or the like.

Figure 6:
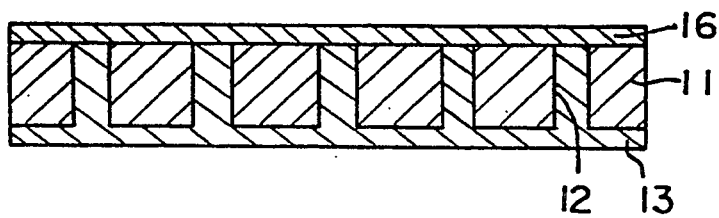
FIG. 6 is a longitudinal explanatory view of showing the heat-conductive material of the second aspect of the present invention.
Figure 7:
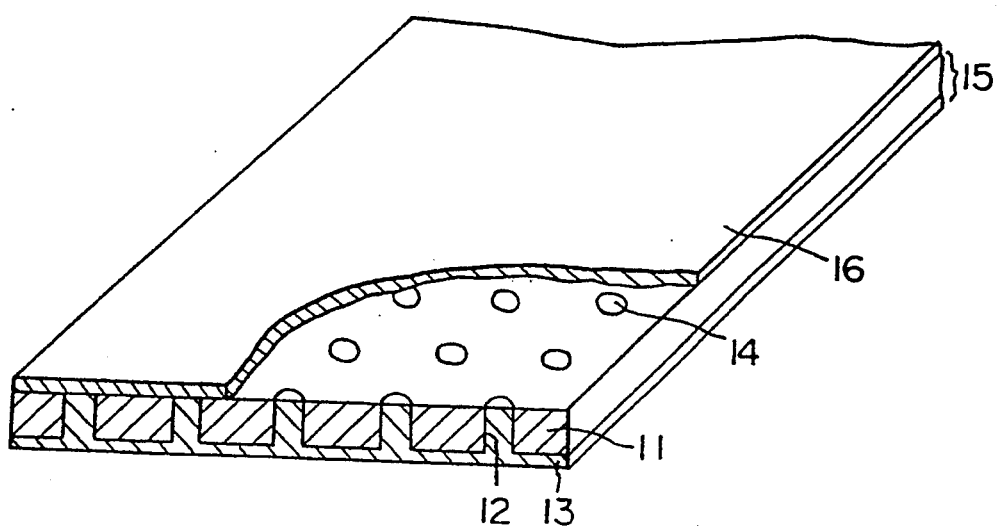
FIG. 7 is a partly-cut perspective view of showing the heat-conductive material of FIG. 6.

FIG. 6 is a longitudinal explanatory view of showing the heat-conductive material of the second aspect of the present invention; and FIG. 7 is a partly-cut perspective view of FIG. 6.

Precisely, FIGS. 6 and 7 show one embodiment of a three-layer heat-conductive material of the present invention, in which a copper sheet is used as a metal sheet of high thermal expansion and a Kovar (Fe—Co—Ni) sheet is used as a metal sheet of low thermal expansion. In this, copper sheet (13)(16) have been welded under pressure to the both surfaces of Kovar sheet (11) having a number of through-holes (12)(12) . . . in the direction of the thickness thereof.

The Kovar sheet (11) of a metal of low thermal expansion has through-holes (12)(12) . . . each having the same dimension in the direction of the thickness of thereof, the copper material of the copper sheet (13) of a metal of high thermal expansion as welded under pressure to one surface of the Kovar sheet (11) has intruded into the through-holes (12)(12) . . . to form copper extruding areas (14)(14) . . . on the other surface of the Kovar sheet (11) (refer to FIG. 7), and this is diffused and integrated with copper sheet (16) as welded under pressure to the same surface of the Kovar sheet (11).

The illustrated embodiment indicates formation of the through-holes (12)(12) . . . each having the same dimension in the direction of the thickness of the sheet (11). Apart from this, the through-holes (12)(12) . . . may be tapered to have different diameters between the both surfaces of the sheet (11), and they may be arranged in such a way that the adjacent through-holes each have a different diameter and that the arrangement comprises combination of large and small through-holes.

By suitably selecting the thickness of each of the copper sheets (13)(16) to be welded under pressure to the both surfaces of the Kovar sheet (12) as well as the ratio and the dispersing condition of the copper exposing surface areas (14)(14) . . . in the three-layer sheet, the thermal characteristics of the respective main surfaces may be made near to the desired ones.

Where the three-layer sheet is used as it is, the outermost layer of the copper sheet (3) may well be selected from Cu, Cu alloys, Al, Al alloys, Ag and Ag alloys in consideration of the use as well as of the material of the thin layer to be laminated to the sheet, whereby the composite material having the three-layer sheet may have improved properties of uniform heat receivability, high heat diffusibility, high weldability to materials to be welded thereto and high adhesiveness to the thin film to be laminated thereto.

Figure 8:
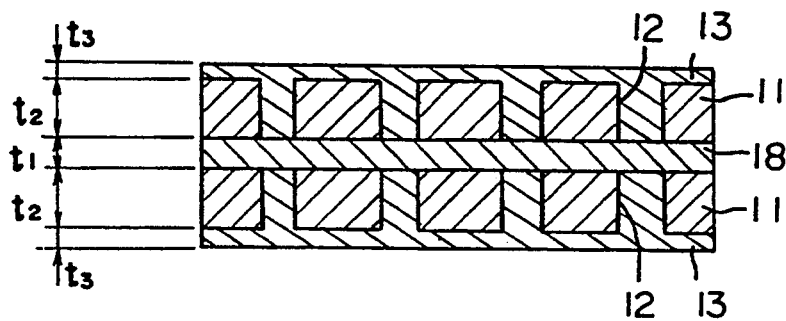
FIG. 8 is a longitudinal explanatory view of showing the heat-conductive material of the third aspect of the present invention.

FIG. 8 shows the heat-conductive material of the third aspect of the present invention, in which two-layer sheets, each composed of Kovar sheet (11) having copper sheet (13) as welded under pressure to one surface thereof, have been laminated in such a way that the Kovar sheets (11)(11) of them face to each other and they have been welded and integrated together under pressure via copper sheet (18).

Figure 9A:
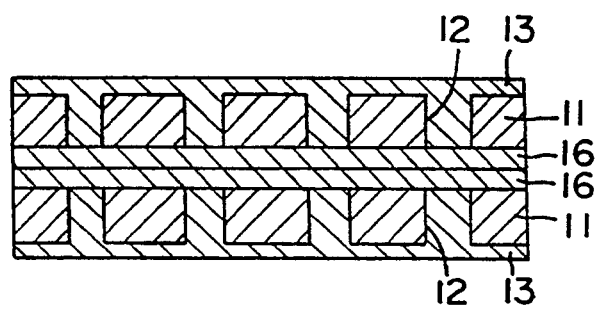
FIGS. 9 (A) and 9(B) are longitudinal explanatory views of each showing the heat-conductive material of the fourth aspect of the present invention.
Figure 9B:
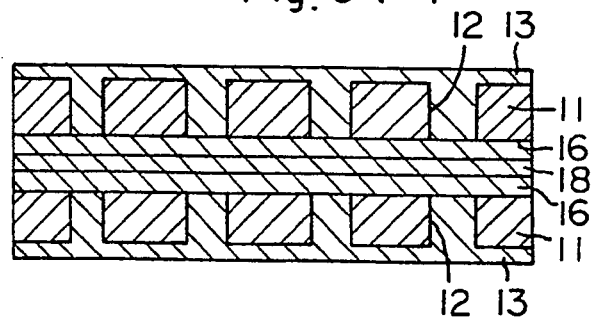

FIGS. 9(A) and 9(B) each show the heat-conductive material of the fourth aspect of the present invention, in which three-layer sheets (each having substantially the same constitution as that of FIG. 6) each as prepared by welding under pressure copper sheet (13) to one surface of Kovar sheet (11) having a number of through-holes (12)(12) . . . in the direction of the thickness thereof and also welding under pressure copper sheet (16) to the other surface thereof have been welded and integrated together under pressure, in such a way that either the main surface of the copper sheet (13) or that of the copper sheet (16) faces to each other ( in both FIGS. 9(A) and 9(B), the copper sheets (16)(16) face to each other ), directly (FIG. 9(A)) or via copper sheet (18) (FIG. 9(B)).

Also in the heat-conductive materials of FIGS. 9(A) and 9(B), the thermal characteristics of the respective main surfaces may suitably be adjusted by selecting the Kovar sheet (2) and the copper sheets (13)(16)(18), like the case of the heat-conductive material of FIG. 6.

Figure 10:
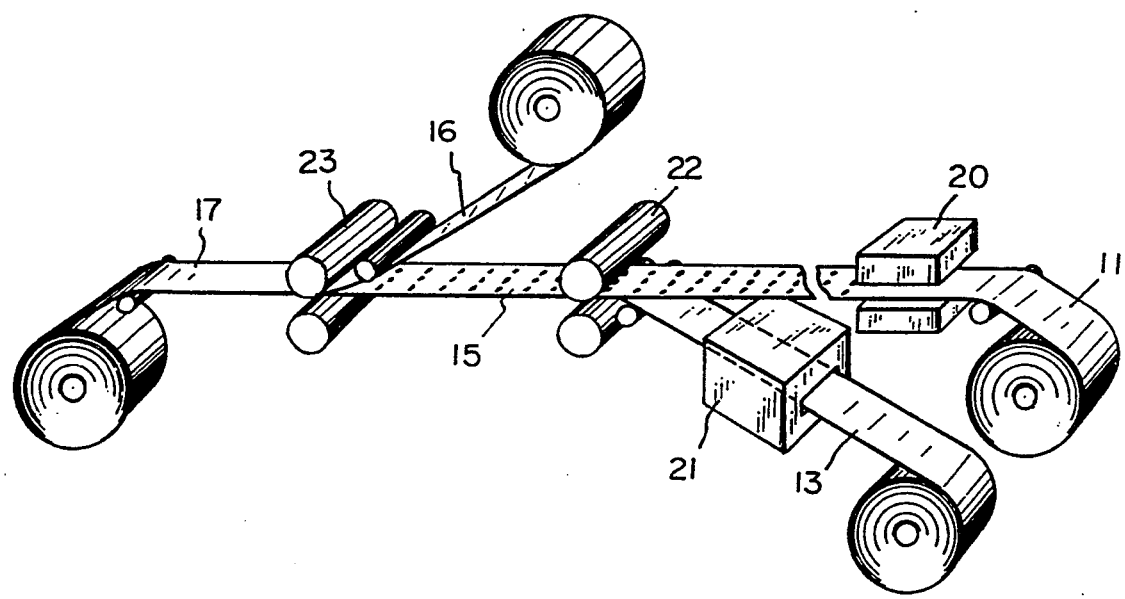
FIG. 10 is a perspective explanatory view of showing one embodiment of the equipment for producing the heat-conductive material of the present invention.

For producing the three-layer heat-conductive material of FIG. 6, which is composed of copper sheets and a Kovar sheet, a coil of Kovar sheet (11) having determined dimension and thickness is first uncoiled and then stamped with stamping machine (20) to form, for example, a number of small through-holes through the sheet to make it to have a reticulate pattern, the stamped sheet of a determined length is stocked in a looper device, copper sheet (13) as uncoiled and previously heated up to a temperature not lower than the recrystallizing temperature thereof in heating furnace (21) is applied from below to the stamped Kovar sheet (11) and welded under pressure thereto to give two-layer sheet (15), as shown in FIG. 10.

Next, a different copper sheet (16) as uncoiled is applied from above to the Kovar sheet (11) of the two-layer sheet (15) and welded under pressure thereto with press-welding machine (23), to thereby obtain three-layer sheet (17) having Kovar sheet (11) with copper sheets (13)(16) as welded under pressure to the both surfaces thereof.

Alternatively, the Kovar sheet (11) may first be stamped with stamping machine (20) to form, for example, a number of small through-holes through the sheet to make it to have a reticulate pattern, then annealed and thereafter surface-treated and coiled.

Where a different copper sheet (16) is welded under pressure to the two-layer sheet (15), the copper sheet (16) may be heated up to a temperature not lower than the recrystallizing temperature thereof whereby diffusion and integration of the copper materials may well be attained.

In preparing the three-layer heat-conductive material which is composed of copper sheets and a Kovar sheet, heating of the copper sheet (13) up to a temperature not lower than the recrystallizing temperature thereof prior to welding thereof under pressure to the Kovar sheet (11) having through-holes is recommended. This is because the copper sheet (13) may intrude into the through-holes (12) of the Kovar sheet (11) under a small pressure so as to be exposed out to the opposite surface of the Kovar sheet (11). As a result, a desired composite material having a high welding strength may be obtained, with no deformation of the shape of the through-holes as provided through the Kovar sheet (11) and without fluctuating the previously determined exposing area ratio between the exposing copper areas (14)(14) . . . (refer to FIG. 7) and the Kovar sheet (11) on the surface of the Kovar sheet (11) and additionally without causing anisotropy of thermal expansion of the composite material.

The three-layer sheet (17) may be prepared by the simple process mentioned above, and it involves extremely few percentages of fault products. Therefore, it may directly be used as a substrate or lead frame as it is; or two three-layer sheets (17)(17) may be welded together under pressure directly or after the copper sheets (13)(16) have been heated up to a temperature not lower than the recrystallizing temperature thereof to give a five-layer heat-conductive material of FIG. 9(A) substantially composed of copper sheets and Kovar sheets.

Alternatively, two three-layer sheets (17)(17) may be welded together under pressure via a metal sheet of high thermal expansion (18), such as a copper sheet, of being a room temperature or having been heated up to a temperature not lower than the recrystallizing temperature thereof, to give a substantially five-layer heat-conductive material of FIG. 9(B).

Where the two-layer sheet (15) as initially obtained in the step of FIG. 10, which is composed of the Kovar sheet (11) with the copper sheet (13) as welded under pressure to one surface thereof and with the copper exposing areas (14)(14) . . . on the other surface thereof, is used and the copper exposing areas (14)(14) . . . of the Kovar sheet (11) are welded together under pressure via the metal sheet of high thermal expansion (18) of being a room temperature or having been heated up to a temperature not lower than the recrystallizing temperature thereof, a five-layer heat-conductive material of FIG. 8 which substantially comprises copper sheets and Kovar sheets is obtained.

In the above-mentioned embodiment, the copper sheet (13) has been heated up to a temperature not lower than the recrystallizing temperature thereof prior to welding, for obtaining the above-mentioned two-layer sheet (15). Apart from this, the welding may be effected at a room temperature and thereafter the welded sheet may be annealed at a low temperature and the thus welded two sheets may further be welded together under pressure via the metal sheet (18) of high thermal expansion of being a room temperature or having been heated up to a temperature not lower than the recrystallizing temperature thereof.

Like the above-mentioned three-layer sheet (17), the thickness of each of the Kovar sheet (11) of the two-layer sheet (15) or three-layer sheet (17), the copper sheets (13)(16) and the metal sheet of high thermal expansion (18) to be interlaid as well as the ratio and the dispersing condition of the copper exposing surface areas (14)(14) . . . may suitably be selected in producing the multi-layer heat-conductive material, whereby the thermal characteristics of the respective main surfaces of the material to be obtained may be made near to the desired ones.

Like the case of producing the above-mentioned heat-conductive material of the first aspect of the present invention, the atmosphere for heating and welding the metal sheet of high thermal expansion in the above-mentioned pressure welding for producing the multi-layer heat-conductive material is desired to be a non-oxidizing one. For instance, employable as the atmosphere is $N_2$, At, $H_2$ or a mixed gas atmosphere of them, as well as an ammonia-decomposed gas or propane combustion gas (DX) atmosphere.

The heating device may suitably be selected in accordance with the material of the metal of high thermal expansion to be used. In general, usable is a tubular furnace column, a light beam heating device, a laser heating device, a high frequency heating device, or a plasma heating device.

The heating temperature for the metal sheet of high thermal expansion may suitably be selected from a temperature range of from the recrystallizing temperature of the selected metal material to lower than the melting point of the same. Preferred is a temperature falling within the range of from a temperature lower than the melting point of the metal material to be heated by 100° C. to lower than the melting point thereof. For instance, for heating a copper or copper alloy sheet, the heating temperature is from 950° to 1050° C.; for heating an Al or Al alloy sheet, it is from 550° to 650° C.; and for heating an Ag or Ag alloy sheet, it is from 800° to 900° C.

The present invention will be explained in more detail by way of the following examples, which, however are not intended to restrict the scope of the present invention.

EXAMPLE 1

A Kovar sheet (29Ni—16Co—Fe alloy ) having a thickness of 0.3 mm and a width of 30 mm was annealed at 900° C. and then wire-brushed, and a Cu foil having a thickness of 0.05 mm and a width of 30 mm was welded under pressure to the both surfaces of the sheet to give a three-layer sheet having a Cu foil thickness of 30 $\mu$m and a total thickness of 0.25 mm. Then, a number of through-holes each having a diameter of 1.0 mm were formed through the sheet with the distance between the holes in the rolled direction being 2.0 mm and the distance between them in the width direction being 2.0 mm.

A Cu sheet having a thickness of 0.5 mm and a width of 30 mm was wire-brushed and then heated up to 800° C., and the previously obtained three-layer sheet was welded under pressure to the both surfaces of the Cu sheet with a welding machine, in the manner as shown in FIG. 4, to thereby obtain a heat-conductive material of FIG. 1(A) substantially composed of five layers and having a thickness of 0.4 mm, in which copper intruded into the through-holes of the Kovar sheet and it was partly exposed out and integrated with the copper foil of the outermost layer in the determined positions. The reduction ratio was 60%.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%.

The thermal conductivity of the thus obtained material was 230 w/m.K in the thickness direction, and the thermal expansion coefficient in each main surface was $8 \times 10^{-6}$/° C.

In the heat-conductive material thus obtained, the thickness of the Cu sheet ($t_1$) was 0.15 mm, the thickness of each Kovar sheet ($t_2$) was 0.115 mm, and the thickness of each surface Cu foil ($t_3$) was 0.01 mm (refer to FIG. 2).

The heat-conductive material having a thickness of 0.4 mm was cut into a determined size. Two of them were laminated to give a heat-releasing substrate (heat sink).

Using the heat-releasing substrate, a ceramic package was prepared. The package was verified to have good heat-releasability and good thermal compatibility.

The heat-conductive material having a thickness of 0.44 mm was annealed in a hydrogen atmosphere for 5 minutes at 1000° C. and then cold-rolled to have a thickness of 0.15 mm. In the heat-conductive material thus obtained, the thickness ($t_1$) of the Cu sheet of constituting the core was 0.068 mm, the thickness ($t_2$) of each Kovar sheet was 0.038 mm, and the thickness ($t_3$) of each surface Cu foil was 0.003 mm.

Next, this was worked into a lead frame by a known method, with which a semiconductor package was formed. In the package thus formed, there was neither peeling in the adhering interface between the chip and the island nor cracking of the sealant resin. This had good heat diffusibility similar to that of a lead frame made of a conventional copper alloy.

EXAMPLE 2

A Kovar sheet (29Ni—16Co—Fe alloy) having a thickness of 0.5 mm and a width of 30 mm was annealed at 900° C. and then wire-brushed, and a Cu foil having a thickness of 0.2 mm and a width of 30 mm was welded under pressure to one surface of the sheet while a Cu foil having a thickness of 0.05 mm and a width of 30 mm to the other surface thereof, to give a three-layer sheet having a Cu foil thickness of 30 μm and a total thickness of 0.29 mm. Then, a number of through-holes each having a diameter of 1.0 mm were formed through the sheet with the distance between the holes in the rolled direction being 2.0 mm and the distance between them in the width direction being 2.0 mm.

A Cu sheet having a thickness of 0.35 mm and a width of 30 mm was wire-brushed and then heated up to 900° C., and the Cu sheet was welded under pressure to the previously obtained three-layer sheet on the surface thereof having a thinner Cu foil, with a welding machine, to thereby obtain a heat-conductive material of FIG. 1(B) substantially-composed of three layers and having a thickness of 0.4 mm, in which copper intruded into the through-holes of the Cu/Kovar composite sheet and it was partly exposed out and integrated with the copper foil of the outermost layer in the determined positions. The reduction ratio was 62%.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%.

The thermal conductivity of the thus obtained material was 250 w/m.K in the thickness direction, and the thermal expansion coefficient in each main surface was $9 \times 10^{-6}/°$ C.

EXAMPLE 3

A Kovar sheet (29Ni—16Co—Fe alloy) having a thickness of 0.5 mm and a width of 30 mm was annealed at 900° C. and then wire-brushed, and a Cu sheet having a thickness of 0.2 mm and a width of 30 mm was welded under pressure to one surface of the sheet to give a two-layer sheet having a Cu layer thickness of 85 μm and a total thickness of 0.3 mm. Then, a number of through-holes each having a diameter of 1.0 mm were formed through the sheet with the distance between the holes in the rolled direction being 2.0 mm and the distance between them in the width direction being 2.0 mm.

A Cu sheet having a thickness of 0.35 mm and a width of 30 mm was wire-brushed and then heated in an $N_2$ atmosphere up to 900° C., and the Cu sheet was welded under pressure to the previously obtained two-layer sheet on the surface of the Kovar side thereof, with a welding machine, to thereby obtain a heat-conductive material of FIG. 1(C) substantially composed of three layers and having a thickness of 0.25 mm, in which copper intruded into the through-holes of the Cu/Kovar composite sheet and it was partly exposed out and integrated with the copper foil of the outermost layer in the determined positions. The reduction ratio was 73%.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%.

The thermal conductivity of the thus obtained material was 250 w/m.K in the thickness direction, and the thermal expansion coefficient in each main surface was $9 \times 10^{-6}/°$ C.

EXAMPLE 4

A Kovar sheet (29Ni—16Co—Fe alloy) having a thickness of 0.5 mm and a width of 30 mm was annealed at 900° C. and then wire-brushed, and a Cu foil having a thickness of 0.2 mm and a width of 30 mm was welded under pressure to one surface of the sheet to give a two-layer sheet having a Cu foil thickness of 60 μm and a total thickness of 0.28 mm. Then, a number of through-holes each having a diameter of 1.0 mm were formed through the sheet with the distance between the holes in the rolled direction being 2.0 mm and the distance between them in the width direction being 2.0 mm. The mean thermal expansion coefficient of the Kovar sheet at 30° to 200° C. was $5.2 \times 10^{-6}/°$ C.

A Cu sheet having a thickness of 0.35 mm and a width of 30 mm was wire-brushed and then heated up to 900° C., and the Cu sheet was welded under pressure to the previously obtained two-layer sheet on the surface of the Kovar side thereof, with a welding machine, to thereby obtain a heat-conductive material of FIG. 1(D) substantially composed of three layers and having a thickness of 0.25 mm, in which copper intruded into the through-holes of the Cu/Kovar composite sheet and it was partly exposed out and integrated with the copper foil of the outermost layer in the determined positions. The reduction ratio was 60%.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%.

The mean thermal expansion coefficient of the Cu sheet at 30° to 200° C. was $17.2 \times 10^{-6}/°$ C. The thermal conductivity of the thus obtained material was 250 w/m.K in the thickness direction, and the thermal expansion coefficient in each main surface was $9 \times 10^{-6}/°$ C.

EXAMPLE 5

A number of through-holes each having a diameter of 1.0 mm were formed through a Kovar sheet (29Ni—16Co—Fe alloy) having a thickness of 0.25 mm and a width of 50 mm with the distance between the through-holes in the rolled direction being 2.0 mm and the distance between them in the width direction being 2.0 mm. The sheet was then annealed at 900° C., then wire-brushed and coiled up. The mean thermal expansion coefficient of the Kovar sheet at 30° to 200° C. was $5.2 \times 10^{-6}$/° C.

A Cu sheet having a thickness of 0.5 mm and a width of 50 mm was wire-brushed and then heated in an $N_2$ atmosphere up to 950° C. This was laminated over the Kovar sheet as uncoiled and was welded together under pressure in an $N_2$ atmosphere with an welding machine to thereby obtain a two-layer sheet having a thickness of 0.3 mm, in which copper intruded into the through-holes of the Kovar sheet and it was partly exposed out and integrated with the copper foil of the surface layer in the determined positions.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%.

A Cu foil having a thickness of 0.05 mm and a width of 50 mm was welded under pressure to the two-layer sheet on the Cu-exposing surface side thereof, to obtain a heat-conductive material of FIG. 6 composed of substantially three layers. The material had a Cu layer having a thickness of 20 $\mu$m as the surface layer and had a total thickness of 0.3 mm. The reduction ratio was 15%.

The mean thermal expansion coefficient of the Cu sheet at 30° to 200° C. was $17.2 \times 10^{-6}$/° C. The thermal conductivity of the thus obtained material was 230 w/m.K in the thickness direction, and the thermal expansion coefficient in each main surface was $8 \times 10^{-6}$/° C.

The three-layer heat-conductive material thus obtained was annealed in a hydrogen atmosphere for 5 minutes at 1000° C. This was worked into a lead frame by a known method, with which a semiconductor package was formed. In the package thus formed, there was neither peeling in the adhering interface between the chip and the island nor cracking of the sealant resin. This had good heat diffusibility similar to that of a lead frame made of a conventional copper alloy.

EXAMPLE 6

A number of through-holes each having a diameter of 1.0 mm were formed through a Kovar sheet (29Ni—16-Co—Fe alloy) having a thickness of 0.25 mm and a width of 50 mm with the distance between the through-holes in the rolled direction being 2.0 mm and the distance between them in the width direction being 2.0 mm. The sheet was then annealed at 900° C., then wire-brushed and coiled up. The mean thermal expansion coefficient of the Kovar sheet at 30° to 200° C. was $5.2 \times 10^{-6}$/° C.

A Cu sheet having a thickness of 0.5 mm and a width of 50 mm was wire-brushed and then heated in an $N_2$ atmosphere up to 950° C. This was laminated over the Kovar sheet as uncoiled and was welded together under pressure in an $N_2$ atmosphere with an welding machine to thereby obtain a two-layer sheet having a thickness of 0.3 mm, in which copper intruded into the through-holes of the Kovar sheet and it was partly exposed out and integrated with the copper foil of the surface layer in the determined positions.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%. The thickness of the Cu layer was 0.18 mm.

The previously obtained Cu/Kovar composite sheet was welded under pressure to both surfaces of a Cu sheet having a thickness of 0.3 mm and a width of 50 mm which had previously been heated in an $N_2$ atmosphere up to 950° C., with the side of the Kovar sheet facing to the Cu sheet, to thereby obtain a heat-conductive material of FIG. 8 composed of substantially three layers. The material had Cu layers of each 60 $\mu$m as the both surface layers and had a Cu center layer of 0.1 mm, and it had a total thickness of 0.3 mm. The reduction ratio was 66%.

The mean thermal expansion coefficient of the Cu sheet at 30° to 200° C. was $17.2 \times 10^{-6}$/° C. The thermal conductivity of the thus obtained material was 230 w/m.K in the thickness direction, and the thermal expansion coefficient in each main surface was $9 \times 10^{-6}$/° C.

The three-layer heat-conductive material thus obtained was annealed in a hydrogen atmosphere for 5 minutes at 1000° C. This was worked into a lead frame by a known method, with which a semiconductor-package was formed. In the package thus formed, there was neither peeling in the adhering interface between the chip and the island nor cracking of the sealant resin. This had good heat diffusibility similar to that of a lead frame made of a conventional copper alloy.

EXAMPLE 7

A number of through-holes each having a diameter of 1.0 mm were formed through a Kovar sheet (29Ni—16-Co—Fe alloy) having a thickness of 0.25 mm and a width of 50 mm with the distance between the through-holes in the rolled direction being 2.0 mm and the distance between them in the width direction being 2.0 mm. The sheet was then annealed at 900° C., then wire-brushed and coiled up. The mean thermal expansion coefficient of the Kovar sheet at 30° to 200° C. was $5.2 \times 10^{-6}$/° C.

A Cu sheet having a thickness of 0.5 mm and a width of 50 mm was wire-brushed and then heated in an $N_2$ atmosphere up to 950° C. This was laminated over the Kovar sheet as uncoiled and was welded together under pressure in an $N_2$ atmosphere with an welding machine to thereby obtain a two-layer sheet having a thickness of 0.3 mm, in which copper intruded into the through-holes of the Kovar sheet and it was partly exposed out and integrated with the copper foil of the surface layer in the determined positions.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%. The thickness of the Cu layer was 0.18 mm.

A Cu foil having a thickness of 0.05 mm and a width of 50 mm was welded under pressure to the previously prepared two-layer sheet at the Cu-exposed surface side thereof, to obtain a heat-conductive material of FIG. 6 composed of substantially three layers. This had Cu layers of each 20 $\mu$m as the both surface layers and had a total thickness of 0.3 mm. The reduction ratio was 15%.

The mean thermal expansion coefficient of the Cu sheet at 30° to 200° C. was $17.2 \times 10^{-6}$/° C. Two three-layer heat-conductive materials thus obtained each were heated in an $N_2$ atmosphere up to 900° C. and were welded together under pressure with the side of having a thinner Cu surface layer facing to each other, to thereby obtain a heat-conductive material of FIG. 9(A) composed of substantially three layers. This had a total thickness of 0.25 mm.

The three-layer heat-conductive material thus obtained was annealed in a hydrogen atmosphere for 5 minutes at 1000° C. As the characteristics of the thus obtained three-layer heat-conductive material, the thermal conductivity thereof was 230 w/m.K in the thickness direction, and the thermal expansion coefficient thereof in each main surface was $8 \times 10^{-6}$/° C. This was worked into a lead frame by a known method, with which a semiconductor package was formed. In the package thus formed, there was neither peeling in the adhering interface between the chip and the island nor cracking of the sealant resin. This had good heat diffusibility similar to that of a lead frame made of a conventional copper alloy.

EXAMPLE 8

A number of through-holes each having a diameter of 1.0 mm were formed through a Kovar sheet (29Ni—16Co—Fe alloy) having a thickness of 0.25 mm and a width of 50 mm with the distance between the through-holes in the rolled direction being 2.0 mm and the distance between them in the width direction being 2.0 mm. The sheet was then annealed at 900° C., then wire-brushed and coiled up. The mean thermal expansion coefficient of the Kovar sheet at 30° to 200° C. was $5.2 \times 10^{-6}$/° C.

A Cu sheet having a thickness of 0.5 mm and a width of 50 mm was wire-brushed and then heated in an $N_2$ atmosphere up to 950° C. This was laminated over the Kovar sheet as uncoiled and was welded together under pressure in an $N_2$ atmosphere with an welding machine to thereby obtain a two-layer sheet having a thickness of 0.3 mm, in which copper intruded into the through-holes of the Kovar sheet and it was partly exposed out and integrated with the copper foil of the surface layer in the determined positions.

The shape of each of the Cu-exposing areas in the main surface of the thus obtained heat-conductive material was almost circular in the rolled direction, and the distance between the through-holes was 2.0 mm in the rolled direction. The ratio of the Cu-exposing surface areas to the Kovar sheet was 35%. The thickness of the Cu layer was 0.18 mm.

A Cu foil having a thickness of 0.05 mm and a width of 50 mm was welded under pressure to the previously prepared two-layer sheet at the Cu-exposed surface side thereof, to obtain a heat-conductive material of FIG. 6 composed of substantially three layers. This had Cu layers of each 20 μm as the both surface layers and had a total thickness of 0.3 mm. The reduction ratio was 15%.

The mean thermal expansion coefficient of the Cu sheet at 30° to 200° C. was $17.2 \times 10^{-6}$/° C. Two three-layer heat-conductive materials thus obtained each were heated in an $N_2$ atmosphere up to 900° C. along with a Cu sheet having a thickness of 0.3 mm and a width of 50 mm. The thus heated two materials were welded together under pressure via the heated Cu sheet, with the side of having a thinner Cu surface layer of each three-layer material facing to the Cu sheet, to thereby obtain a heat-conductive material of FIG. 9(B) composed of substantially three layers. This had a total thickness of 0.4 mm. The thermal conductivity of the thus obtained heat-conductive material was 240 w/m.K in the thickness direction, and the thermal expansion coefficient thereof in each main surface was $9.5 \times 10^{-6}$/° C.

The three-layer heat-conductive material thus obtained was annealed in a hydrogen atmosphere for 5 minutes at 1000° C. This was worked into a lead frame by a known method, with which a semiconductor package was formed. In the package thus formed, there was neither peeling in the adhering interface between the chip and the island nor cracking of the sealant resin. This had good heat diffusibility similar to that of a lead frame made of a conventional copper alloy.

EXAMPLE 9

A Kovar sheet (29Ni—16Co—Fe alloy) having a thickness of 0.6 mm and a width of 50 mm was annealed at 900° C. and wire-brushed, and a Cu foil having a thickness of 0.25 mm and a width of 30 mm was welded under pressure to one surface of the sheet to give a two-layer sheet having a Cu foil thickness of 90 μm and a total thickness of 0.33 mm. A number of through-holes each having a diameter of 1.0 mm were formed through the thus prepared two-layer sheet with the distance between the through-holes in the rolled direction being 2.0 mm and the distance between them in the width direction being 2.0 mm. The mean thermal expansion coefficient of the Kovar sheet at 30° to 200° C. was $5.2 \times 10^{-6}$/° C.

A Cu sheet having a thickness of 0.45 mm and a width of 30 mm was wire-brushed, and this was welded under pressure to the previously obtained two-layer sheet on the side of the Kovar sheet, with an welding machine, to thereby obtain a three-layer heat-conductive material of FIG. 1(D) composed of substantially three layers and having a total thickness of 0.3 mm, in which copper intruded into the through-holes of the Cu/Kovar composite sheet and it was partly exposed out and integrated with the copper foil of the outermost layer in the determined positions.

The shape of each of the Cu-exposing areas in the main surface of the thus obtained heat-conductive material was almost circular in the rolled direction, and the distance between the through-holes was 2.5 mm in the rolled direction. The ratio of the Cu-exposing surface areas to the Kovar sheet was 33%.

The mean thermal expansion coefficient of the Cu sheet at 30° to 200° C. was $17.2 \times 10^{-6}$/° C. The thermal conductivity of the thus obtained heat-conductive material was 270 w/m.K in the thickness direction, and the thermal expansion coefficient thereof in each main surface was $9 \times 10^{-6}$/° C.

In this example, the Cu sheet was not heated prior to being welded under pressure to the Cu/Kovar composite sheet but was welded thereto at a room temperature.

In the case that the amount of copper to be intruded into through-holes of a composite sheet is relative small, or in the case of using a part usable even though it has a relatively large thermal expansion coefficient or using one having such a constitution that the amount of copper therein is large relative to the whole amount thereof, a heat-conductive material having a desired dimension may be obtained without imparting a large load thereto. Therefore, in the case, a welding means to be effected at a room temperature may be employed.

However, even though the material mentioned above is to be obtained, the copper metal sheet of high thermal expansion may be heated up to a temperature not lower than the recrystallizing temperature thereof, prior to welding, thereby to elevate the welding strength and to minimize the deformation of the through-holes.

In producing the heat-conductive materials of all the above-mentioned aspects of the present invention, the metal sheet of high thermal expansion, which is disposed essentially for improving the thermal conductivity of the materials, is welded under pressure to other parts to be integrated therewith, at a room temperature or after the sheet has been heated up to a temperature not lower than the recrystallizing temperature thereof. As a result, the welding strength may be elevated, and additionally, the thermal expansion coefficient and thermal conductivity of the heat-conductive material thus produced may be varied to any desired ones without varying the thickness ratio of the metal sheets of constituting the material and without varying the surface area ratio of the through-holes. Accordingly, the heat-conductive materials thus produced according to the present invention may satisfy both the compatibility with materials to be applied thereto, such as metals, ceramics, semiconductors (e.g., Si) and plastics, with respect to the thermal expansion coefficients of them, and the good thermal conductivity of themselves. In addition, they may receive evenly the heat as applied thereto and have an improved heat-diffusing effect, and they are free from fine pores on the surfaces and therefore have excellent adhesiveness to thin films of plating materials or brazing materials. Accordingly, the heat-conductive materials of the present invention are the best ones as materials of heat-releasing substrates for mounting semiconductor chips thereon and as materials for lead frames.

In particular, in producing the heat-conductive material of the first aspect of the present invention, since the welding operation, which involves a factor of varying the thickness ratio of the constitutive metal sheets and the surface area ratio of the through-holes, is effected only once, the process is simple and may yield the intended heat-conductive material at a low cost.

While the invention has been described in detail and with reference to specific embodiments thereof, it will be apparent to one skilled in the art that various changes and modifications can be made therein without departing from the spirit and scope thereof.

What is claimed is:

1. A heat-conductive material comprising a metal sheet of high thermal expansion which is heated at room temperature or a temperature higher than a recrystallizing temperature and a metal sheet of low thermal expansion having a metal foil of high thermal expansion clad on at least an outer surface thereof and a plurality of through-holes formed in the direction of thickness thereof, wherein said metal sheet of low thermal expansion is pressure-welded onto either one surface or both surfaces of said metal sheet of high thermal expansion so as to protrude the metal material of said metal sheet of high thermal expansion through said through-holes to be exposed to a surface of said metal foil of high thermal expansion.

2. The heat-conductive material as claimed in claim 1, in which the metal sheet of high thermal expansion is one selected from the group consisting of Cu, Cu alloys, Al, Al alloys, Ag and Ag alloys.

3. The heat-conductive material as claimed in claim 1, in which the metal sheet of low thermal expansion is one selected from the group consisting of Mo, Ni—Fe alloys having an Ni content of from 30 to 50% by weight, Ni—Co—Fe alloys having an Ni content of from 25 to 35% by weight and a Co content of from 4 to 20% by weight, and W.

4. The heat-conductive material as claimed in claim 1, in which the metal foil of high thermal expansion is one selected from the group consisting of Cu, Cu alloys, Al, Al alloys, Ag and Ag alloys.

5. The heat-conductive material as claimed in claim 1, which has been coated with a metal plate of one of the group consisting of Cu, Al, Ni and Sn at a desired portion of at least one main surface.

6. A heat-releasing substrate for mounting chips thereon, made of the heat-conductive material as claimed in claim 1.

7. A lead frame made of the heat-conductive material as claimed in claim 1.

8. A method of producing a heat-conductive material, in which a two-layer material to be formed by welding and integrating under pressure a metal foil of high thermal expansion with one surface of a metal sheet of low thermal expansion followed by forming a number of through-holes through the integrated body in the direction of the thickness thereof is welded to and integrated with one surface or both surfaces of a metal sheet of high thermal expansion at room temperature or at a temperature not lower than the recrystallizing temperature thereof at the side of the metal sheet of low thermal expansion of the integrated body in such a way that the metal of high thermal expansion is exposed out to the surface of the metal foil of high thermal expansion through the through-holes to be integrated with the latter.

9. A method of producing a heat-conductive material, in which a three-layer material to be formed by welding and integrating under pressure a metal foil of high thermal expansion with one surface of a metal sheet of low thermal expansion followed by forming a number of through-holes through the integrated body in the direction of the thickness thereof is welded to and integrated with one surface or both surfaces of a metal sheet of high thermal expansion at room temperature or at a temperature not lower than the recrystallizing temperature thereof in such a way that the metal of high thermal expansion is exposed out to the surface to the metal foil of high thermal expansion through the through-holes to be integrated with the latter.

10. The method of producing a heat-conductive material as claimed in claims 8 or 9, in which the metal sheet of high thermal expansion is one selected from the group consisting of Cu, Cu alloys, Al, Al alloys, Ag and Ag alloys.

11. The method of producing a heat-conductive material as claimed in claims 8 or 9, in which the metal sheet of low thermal expansion is one selected from the group consisting of Mo, Ni—Fe alloys having an Ni content of from 30 to 5% by weight, Ni—Co—Fe alloys having an Ni content of from 25 to 35% by weight and a Co content of from 4 to 20% by weight, and W.

12. The method of producing a heat-conductive material as claimed in claims 8 or 9, in which the metal foil of high thermal expansion is one selected from the group consisting of Cu, Cu alloys, Al, Al alloys, Ag and Ag alloys.

13. The method of producing a heat-conductive material as claimed in claims 8 or 9, in which the metal sheet of high thermal expansion is heated up to a temperature not lower than the recrystallizing temperature thereof prior to welding.

14. The method of producing a heat-conductive material as claimed in claim 13, wherein said method is carried out in a non-oxidizing atmosphere.

* * * * *